United States Patent
Ahn et al.

(10) Patent No.: US 8,524,615 B2
(45) Date of Patent: Sep. 3, 2013

(54) METHOD OF FORMING HARDENED POROUS DIELECTRIC LAYER AND METHOD OF FABRICATING SEMICONDUCTOR DEVICE HAVING HARDENED POROUS DIELECTRIC LAYER

(75) Inventors: Sang-Hoon Ahn, Hwaseong-si (KR); Byung-Hee Kim, Seocho-gu (KR); Sang-Don Nam, Gangnam-gu (KR); Kyu-Hee Han, Hwaseong-si (KR); Gil-heyun Choi, Seoul (KR); Jang-Hee Lee, Yongin-si (KR); Jong-Min Baek, Suwon-si (KR); Kyoung-Hee Kim, Seo-gu (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 44 days.

(21) Appl. No.: 13/238,297

(22) Filed: Sep. 21, 2011

(65) Prior Publication Data

US 2012/0083117 A1   Apr. 5, 2012

(30) Foreign Application Priority Data

Sep. 30, 2010   (KR) .................. 10-2010-0095272

(51) Int. Cl.
*H01L 21/469* (2006.01)
*H01L 21/31* (2006.01)
*H01L 21/44* (2006.01)

(52) U.S. Cl.
USPC ..................... 438/781; 438/778; 438/675

(58) Field of Classification Search
USPC .............................. 438/781, 778, 675
See application file for complete search history.

(56) References Cited

U.S. PATENT DOCUMENTS

| | | | | |
|---|---|---|---|---|
| 7,015,150 | B2 * | 3/2006 | Cooney et al. | 438/765 |
| 7,217,648 | B2 * | 5/2007 | Lu et al. | 438/618 |
| 7,482,265 | B2 * | 1/2009 | Chen et al. | 438/637 |
| 7,838,440 | B2 * | 11/2010 | Park | 438/780 |
| 2003/0218253 | A1 * | 11/2003 | Avanzino et al. | 257/758 |
| 2004/0130027 | A1 * | 7/2004 | Chen et al. | 257/758 |
| 2007/0228570 | A1 * | 10/2007 | Dimitrakopoulos et al. | 257/754 |

FOREIGN PATENT DOCUMENTS

| JP | 2009152402 A | 7/2009 |
|---|---|---|
| KR | 20060039923 A | 5/2006 |
| KR | 20090116477 A | 11/2009 |

* cited by examiner

*Primary Examiner* — Luan C Thai
(74) *Attorney, Agent, or Firm* — Harness, Dickey & Pierce, P.L.C.

(57) ABSTRACT

Example embodiments relate to a method of forming a hardened porous dielectric layer. The method may include forming a dielectric layer containing porogens on a substrate, transforming the dielectric layer into a porous dielectric layer using a first UV curing process to remove the porogens from the dielectric layer, and transforming the porous dielectric layer into a crosslinked porous dielectric layer using a second UV curing process to generate crosslinks in the porous dielectric layer.

20 Claims, 12 Drawing Sheets

FIRST UV LIGHT

METHOD OF FORMING HARDENED POROUS DIELECTRIC LAYER AND METHOD OF FABRICATING SEMICONDUCTOR DEVICE HAVING HARDENED POROUS DIELECTRIC LAYER

CROSS-REFERENCE TO RELATED APPLICATION

This application claims priority under 35 U.S.C. §119 to Korean Patent Application No. 10-2010-0095272, filed on Sep. 30, 2010, the disclosure of which is hereby incorporated by reference in its entirety.

BACKGROUND

1. Field

Example embodiments of the inventive concepts relate to methods of forming a hardened porous dielectric layer and methods of fabricating semiconductor devices having a hardened porous dielectric layer.

2. Description of Related Art

With the increase in integration density of semiconductor devices, intervals between interconnections have been getting narrower. Accordingly, interconnections have been foamed of lower-resistance conductive materials, and insulating layers have been formed of dielectric materials to reduce resistance-capacitance (RC) delay.

SUMMARY

Example embodiments of the inventive concepts relate to methods of forming a hardened porous dielectric layer and methods of fabricating semiconductor devices having a hardened porous dielectric layer.

In accordance with a non-limiting aspect of the inventive concepts, a method of forming a hardened porous dielectric layer may include forming a dielectric layer containing porogens on a substrate, transforming the dielectric layer into a porous dielectric layer using a first UV curing process to remove the porogens from the dielectric layer, and transforming the porous dielectric layer into a crosslinked porous dielectric layer using a second UV curing process to generate crosslinks in the porous dielectric layer. The first UV curing process may include irradiating a first UV light including broadband wavelengths in which wavelengths being equal to or less than 280 nm are equal to or less than 15% of a first total intensity of the first UV light. The second UV curing process may include irradiating a second UV light including broadband wavelengths in which wavelengths being equal to or less than 280 nm are equal to or more than 15% of a second total intensity of the second UV light.

In accordance with another non-limiting aspect of the inventive concepts, a method of fabricating a semiconductor device having a hardened porous dielectric layer may include forming a dielectric layer containing porogens on a substrate and irradiating ultra-violet (UV) light onto the dielectric layer. Irradiating the UV light may include a first UV curing process including irradiating a first UV light having broadband wavelengths in which wavelengths being equal to or less than 280 nm are equal to or less than 15% of a first total intensity of the first UV light. Irradiating the UV light may further include a second UV curing process including irradiating a second UV light having broadband wavelengths in which wavelengths being equal to or less than 280 nm are equal to or more than 15% of a second total intensity of the second UV light.

In accordance with still another non-limiting aspect of the inventive concepts, a method of fabricating a semiconductor device having a hardened porous dielectric layer may include forming a dielectric layer containing porogens on a substrate, transforming the dielectric layer into a porous dielectric layer having pores by performing a first ultraviolet (UV) curing process to remove the porogens from the dielectric layer, transforming the porous dielectric layer into a crosslinked porous dielectric layer by performing a second UV curing process, transforming the crosslinked porous dielectric layer into a hardened porous dielectric layer by performing a third UV curing process to passivate walls of the pores, and forming a metal interconnection in the hardened porous dielectric layer. The first UV curing process may include irradiating a first UV light having broadband wavelengths in which wavelengths being equal to or less than 280 nm are equal to or less than 15% of a first total intensity of the first UV light. Each of the second and third UV curing processes may include irradiating a second UV light and a third UV light having broadband wavelengths in which wavelengths being equal to or less than 280 nm are equal to or more than 15% of a second total intensity of the second UV light and a third total intensity of the third UV light.

BRIEF DESCRIPTION OF THE DRAWINGS

The foregoing and other features and advantages of the inventive concepts will be more apparent from the detailed description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
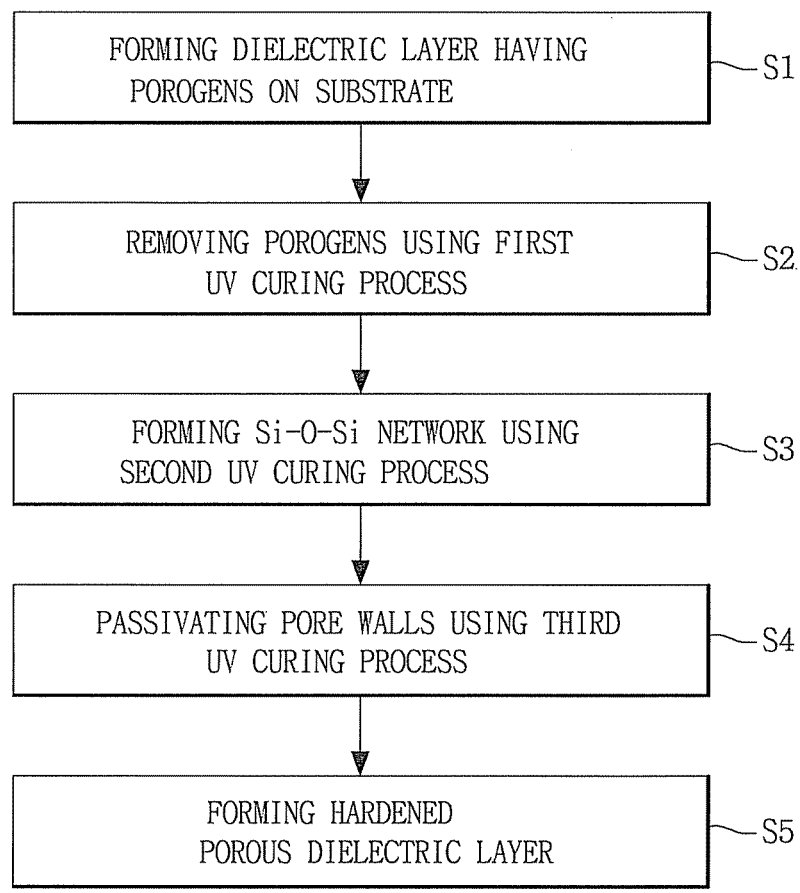
FIG. 1 is a flowchart illustrating a method of forming a hardened porous dielectric layer according to example embodiments of the inventive concepts.

Various embodiments will now be described more fully with reference to the accompanying drawings. This inventive concepts may, however, be embodied in different forms and should not be construed as limited to the various embodiments set forth herein. Rather, these non-limiting embodiments are provided so that this disclosure is thorough and complete and fully conveys the scope of the inventive concepts to one skilled in the art.

Like numbers refer to like elements throughout. In the drawings, the thicknesses of layers and regions may have been exaggerated for clarity. It will also be understood that when a layer is referred to as being "on" another layer or substrate, it can be directly on the other layer or substrate or intervening layers may also be present.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a flowchart illustrating a method of forming a hardened porous dielectric layer according to example embodiments of the inventive concepts, and FIGS. 2A through 2D are cross-sectional views illustrating a method of forming a hardened porous dielectric layer according to example embodiments of the inventive concepts.

Figure 2A:
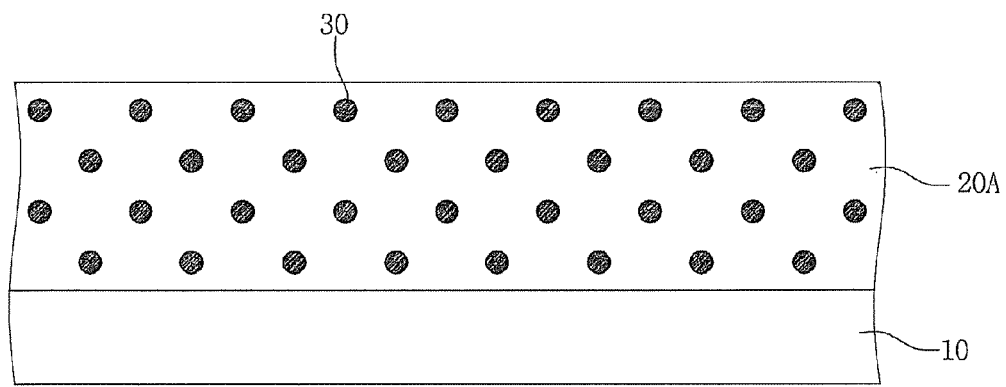
FIGS. 2A through 2D are cross-sectional views illustrating a method of forming a hardened porous dielectric layer according to example embodiments of the inventive concepts.

Referring to FIGS. 1 and 2A, a dielectric layer 20A containing pore generators (hereinafter, "porogens") 30 may be formed on a substrate 10 (S1). In a non-limiting embodiment, the dielectric layer 20A is not processed by any hardening processes.

In this case, the dielectric layer 20A may be formed using a chemical vapor deposition (CVD) process or a spin coating process. The dielectric layer 20A may include a low-k dielectric material having a lower dielectric constant than a conventional oxide or nitride material layer to solve a resistance-capacitance (RC) delay. The dielectric layer 20A may be a carbon-doped silicon oxide (SiOCH) layer, a silicon oxycarbide (SiOC) layer, or a silicon oxyfluoride (SiOF) layer. However, it should be understood that example embodiments of the inventive concepts are not limited thereto.

Meanwhile, the dielectric layer 20A may contain the porogens 30 uniformly distributed therein. Pores may be formed by removing the porogens 30 so that the dielectric constant of the dielectric layer 20A can be further reduced.

In this case, the porogens 30 may be formed of at least one selected from the group consisting of branched poly(p-xylene), linear poly(p-phenylene), linear polybutadiene, branched polyethylene, poly(ethylene terephthalate) (PET), polyamide-6,6 (Nylon 6/6), syndiotactic polystyrene (PS-syn), polycaprolactone (PCL), poly(propylene oxide) (PPO), polycarbonate, poly(phenylene sulfide) (PPS), polyamideimide (PAD, polyphthalamide (PPA or Amodel), polymethylstyrene (PMS), polyetheretherketone (PEEK), poly(ether sulfone) (PES), poly(etherketone) (PEK), polyoxymethylene (POM), poly(butylene terephthalate) (PBT), polystyrene (PS), poly(norbornene), cetyltrimethylammonium bromide (CTAB), poly(ethylene oxide-b-propylene oxide-b-ethylene oxide) (PEO-b-PPO-b-PEO), and cyclodextrin (CD). The porogens 30 may be formed of pseudo-hydrocarbon expressed by one of the following Formulae 1 through 7, particularly, a carbon-ring-type compound. However, the present inventive concepts are not limited to the above-described materials of the porogens 30.

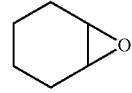

CHO

[Formula 1]

CPO

[Formula 2]

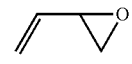

BMO

[Formula 3]

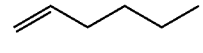

1-Hexene

[Formula 4]

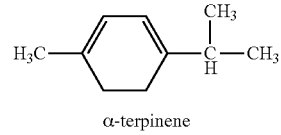

α-terpinene

[Formula 5]

Norbornene

[Formula 6]

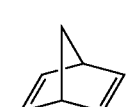

Norbornadiene/Bicyclohexadiene (BCHD)

[Formula 7]

The substrate 10 may be a rigid substrate or a flexible plastic substrate. The rigid substrate may be a substrate including at least one semiconductor material selected from the group consisting of silicon (Si), germanium (Ge), SiGe, gallium phosphorus (GaP), gallium arsenic (GaAs), silicon carbon (SiC), SiGeC, indium arsenic (InAs), and InP, a silicon-on-insulator (SOI) substrate, a quartz substrate, or a glass substrate for a display device. The flexible plastic substrate may be formed of polyimide, polyethylene terephthalate (PET), polyethylene naphthalate (PEN), polymethyl methacrylate (PMMA), polycarbonate (PC), polyethersulfone (PES), or polyester.

Meanwhile, forming the dielectric layer 20A on the substrate 10 does not necessarily refer to forming the dielectric layer 20A directly on the substrate 10. For example, a plurality of conductive layers, dielectric layers, or insulating layers may be formed between the substrate 10 and the dielectric layer 20A. In a non-limiting embodiment, the formation of the dielectric layer 20A is illustrated as occurring directly on the substrate 10.

Figure 2B:
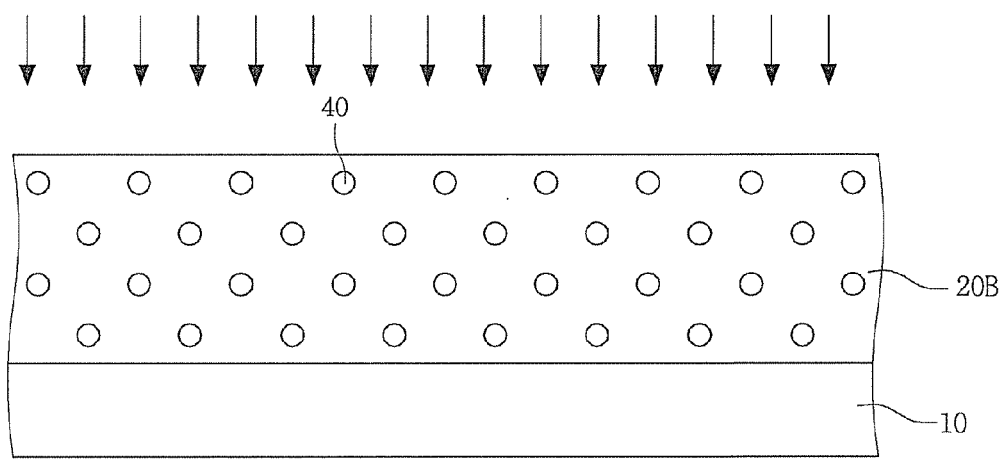

Referring to FIGS. 1 and 2B, the porogens 30 may be removed from the dielectric layer 20A using a first ultraviolet (UV) curing process including UV light irradiation (S2).

All the porogens 30 may be removed using the first UV curing process. By forming pores 40 in places where the porogens 30 existed, the dielectric layer 20A may transform into a porous dielectric layer 20B having a lower dielectric constant than the dielectric layer 20A. The porous dielectric layer 20B having the pores 40 may have a dielectric constant between 1 and 2.5.

In the present non-limiting embodiment of the inventive concepts, the first UV curing process may be performed using a first UV light having broadband wavelengths in which partially summed intensities of each wavelength being equal to or less than 280 nm occupies equal to or less than 15% of total intensity of the first UV light.

Figure 5:
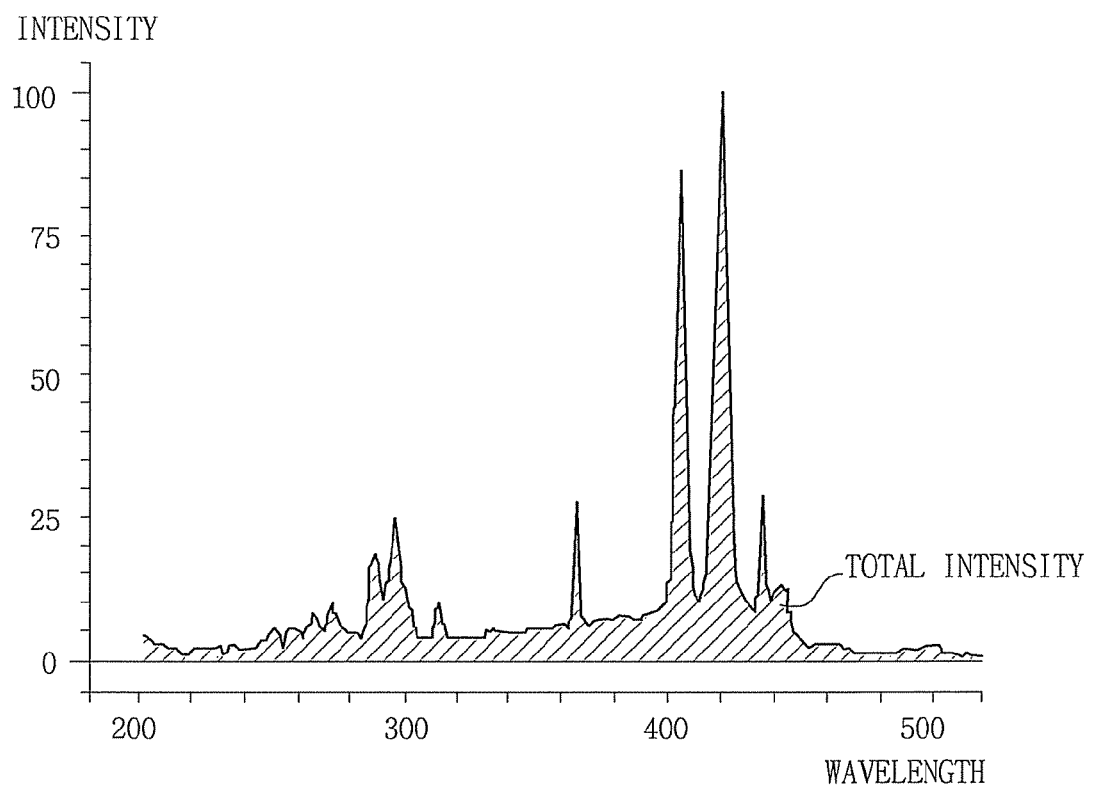
FIG. 5 is a graph showing an example of intensities of UV light having broadband wavelengths used in an ultra-violet (UV) curing process.

FIG. 5 is a graph showing an example of intensities of any UV light having broadband wavelengths used in the first UV curing process.

Referring to FIG. 5, the total intensity of the first UV light having broadband wavelengths may have individual intensities according to each wavelength. In this case, a value (i.e., a slashed region) obtained by integrating the individual intensities according to each wavelength corresponds to the total intensity.

More specifically, when the partially summed intensities of each wavelength being equal to or less than 280 nm occupies equal to or less than 15% of the total intensity, a value obtained by integrating each intensity value having wavelengths being equal to or less than 280 nm occupies equal to or less than 15% of the total intensity.

Meanwhile, the first UV curing process may be performed under process conditions of a temperature between 300 and 500° C. and a pressure between 1 and 100 Torr in an atmosphere of ammonia ($NH_3$), hydrogen ($H_2$), or an oxygen (O)-containing gas, such as nitrous oxide ($N_2O$), hydrogen peroxide ($H_2O_2$), or water ($H_2O$).

In addition, to efficiently remove porogens and prevent breakage of Si—C and Si—O bonds, the broadband wavelengths of the first UV light may include wavelengths being equal to or more than 260 nm, particularly, 280 nm.

The Table 1 shows possible bonds of solid-state Si in the porous dielectric layer 20B, and bonding energies thereof when the porous dielectric layer 20B is, for example, a SiCOH layer.

TABLE 1

| Kinds of bonds | Bonding energy (eV) |
| --- | --- |
| Si—H | 3.31 |
| O—H | 4.80 |
| Si—C | 4.7 |
| Si—OH | 7.89 |
| Si—O | 8.3 |

When the first UV light is irradiated to the porous dielectric layer 20B to remove the porogens, light energy of the first UV light needs to be lower than the bonding energy of a Si—C bond. Because, when the Si—C bond is broken, the SiCOH layer itself may be structurally changed, thus causing crosslinking in the SiCOH layer before removing lower porogens. The crosslinking may lead the porogens to be confined and remain in the SiCOH layer so that the SiCOH layer can have a relatively high dielectric constant, and leakage current can be increased.

Accordingly, the broadband wavelengths of the first UV light may have wavelengths being equal to or greater than 260 nm, particularly, 280 nm, which may have lower energy than bonding energy (4.7 eV) of the Si—C bond.

Figure 2C:
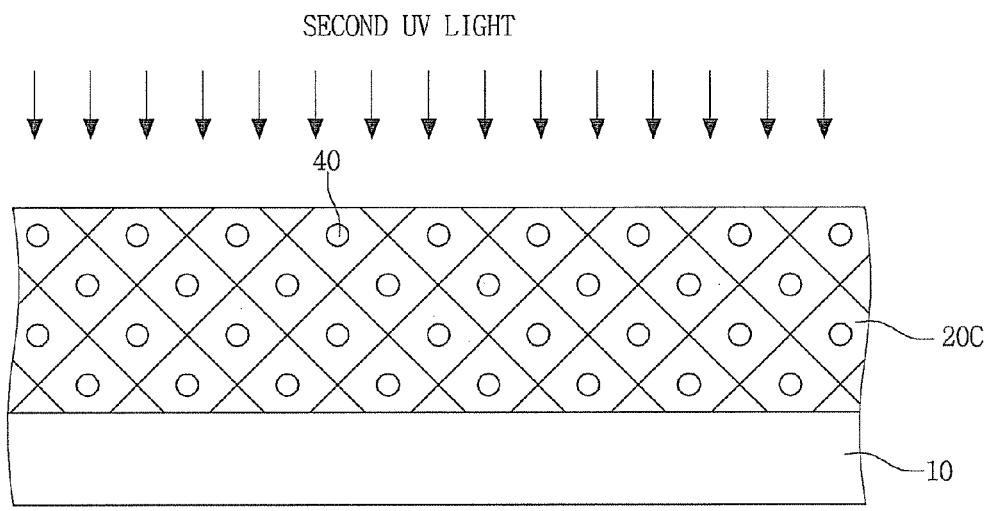

Referring to FIGS. 1 and 2C, a Si—O—Si network may be formed using a second UV curing process (S3) including a second UV light irradiation.

The porous dielectric layer 20B in which the pores 40 are formed by removing the porogens 30 using the first UV curing process may have a relatively low dielectric constant but lack sufficient hardness.

Accordingly, in the inventive concepts, the porous dielectric layer 20B may be transformed into a crosslinked porous dielectric layer 20C by the second UV curing process.

The formation of the crosslinked porous dielectric layer 20C may include forming a Si—O—Si bond to convert a cage-like structure into a network structure, which will be defined as formation of a Si—O—Si network in the present non-limiting embodiment of the inventive concepts.

After the second UV curing process, the hardness of the porous dielectric layer 20B may increase because the Si—H bond and the Si—OH bond are bonded to the Si—O—Si bond which the Si—O—Si is more stable than the Si—H and Si—OH bonds.

According to the inventive concepts, the second UV curing process may be performed using a second UV light having broadband wavelengths in which partially summed intensities of each wavelength being equal to or less than 280 nm occupies equal to or more than 15% of total intensity of the second UV light. In other words, the partially summed intensities of each wavelength being equal to or more than 280 nm in the second UV light occupies equal to or less than 15% of total intensity.

When the partially summed intensities of each wavelength being equal to or less than 280 nm occupies equal to or more than 15% of the total intensity, a value obtained by integrating each intensity value having a wavelength being equal to or less than 280 nm occupies equal to or more than 15% of the total intensity. Alternatively, the second UV curing process may be performed using a second UV light having broadband wavelengths in which partially summed intensities of each wavelength being equal to or less than 260 nm occupies equal to or more than 15% of the total intensity.

Meanwhile, the second UV curing process may be performed under process conditions of a temperature between 300 and 500° C. and a pressure between 1 and 100 Torr in an atmosphere of an O-containing gas, such as $N_2O$, $H_2O_2$, $O_2$, or $H_2O$.

In addition, to efficiently form the Si—O—Si network and simultaneously, prevent breaks in the Si—C bond and the Si—O bond of the porous dielectric layer 20B, the broadband wavelengths may be equal to or more than 260 nm.

Figure 2D:
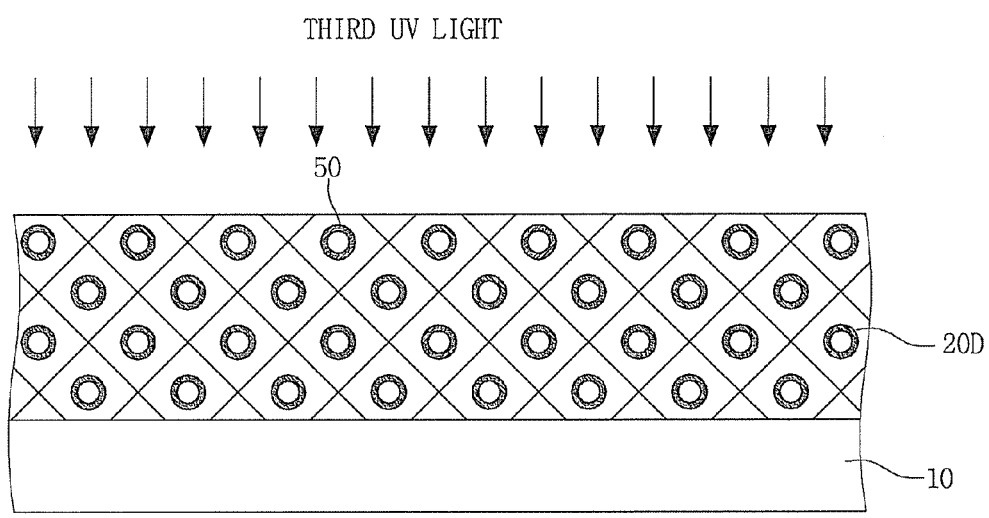

Referring to FIGS. 1 and 2D, a pore wall 50 may be passivated using a third UV curing process (S4) including UV light irradiation.

Since the carbon content of the crosslinked porous dielectric layer 20C that has undergone the first and second UV curing processes is reduced, a pore wall 50 may be passivated using a third UV curing process to increase the carbon content of the crosslinked porous dielectric layer 20C.

In the present non-limiting embodiment of the inventive concepts, the third UV curing process may use the same UV light as the second UV light. However, since the third UV curing process is required to increase the carbon content of the crosslinked porous dielectric layer 20C, the third UV curing process may be performed using a process gas containing carbon atoms corresponding to a general expression: $C_xH_y$. Specifically, the process gas may be $C_2H_2$, $C_2H_4$, $C_3H_6$, or etc.

The third UV curing process may be performed under process conditions of a temperature between 100 and 450° C. and a pressure between 1 and 100 Torr.

Also, to efficiently increase the carbon content of the crosslinked porous dielectric layer 20C and prevent breaks in the Si—C bond and the Si—O bond of the crosslinked porous dielectric layer 20C, the broadband wavelengths of the third UV light may be equal to or more than 260 nm, particularly, 280 nm.

As a result, the crosslinked porous dielectric layer 20C may be transformed into a hardened porous dielectric layer 20D according to the inventive concepts (S5).

Figure 3:
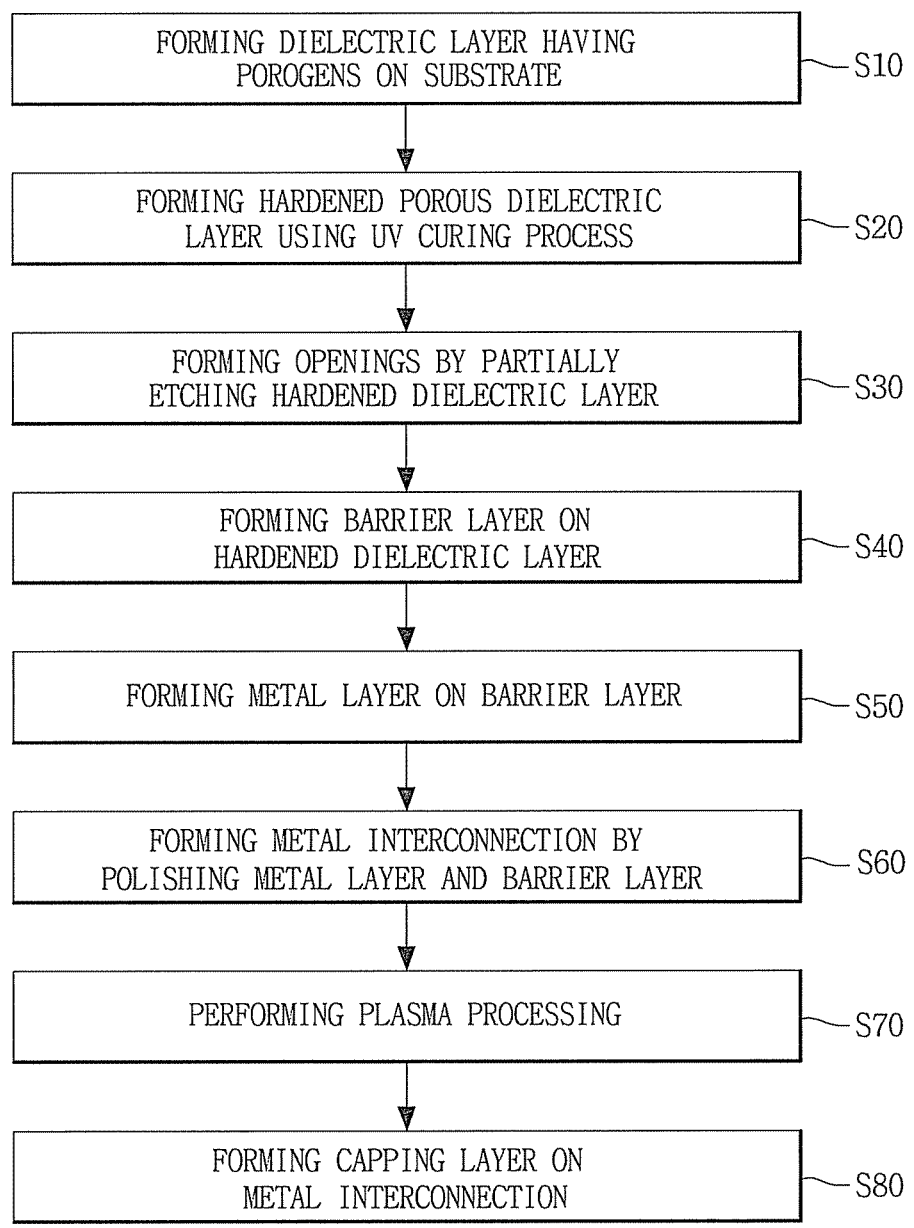
FIG. 3 is a flowchart illustrating a method of fabricating a semiconductor device having a hardened porous dielectric layer according to example embodiments of the inventive concepts.

FIG. 3 is a flowchart illustrating a method of manufacturing a semiconductor device including a hardened porous dielectric layer according to example embodiments of the inventive concepts, and FIGS. 4A through 4I are cross-sectional views illustrating a method of manufacturing a semiconductor device including a hardened porous dielectric layer according to example embodiments of the inventive concepts.

Figure 4A:
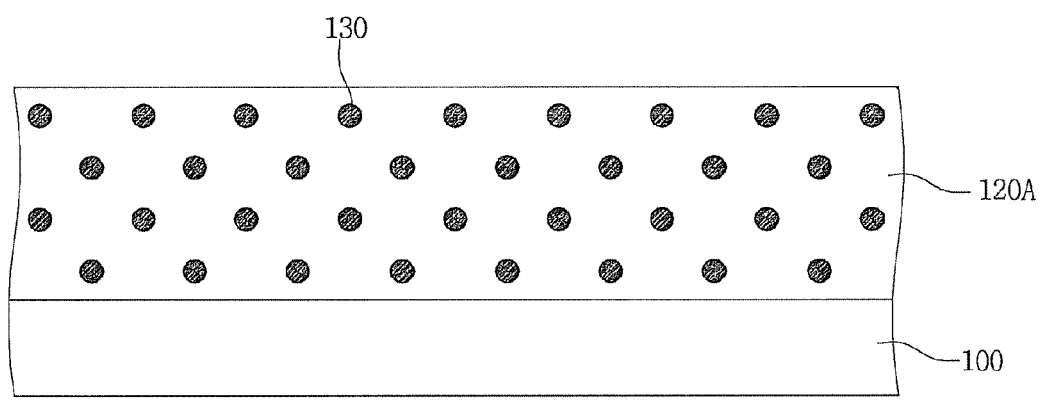
FIGS. 4A through 4I are cross-sectional views illustrating a method of fabricating a semiconductor device having a hardened porous dielectric layer according to example embodiments of the inventive concepts.

Referring to FIGS. 3 and 4A, a low-dielectric layer 120A containing porogens 130 may be formed on a substrate 100 (S10). Here, the dielectric layer 120A may be formed using a CVD process or a spin coating process. The dielectric layer 120A may include a low-k dielectric material having a lower dielectric constant than a basic oxide or nitride material layer to solve RC delay. The dielectric layer 120A may be formed of one selected from the group consisting of a SiOCH layer, a SiOC layer, and a SiOF layer that contains the porogens 130, but it should be understood that the inventive concepts are not limited thereto. Meanwhile, the dielectric layer 120A may contain the porogens 130 uniformly distributed therein. Pores may be formed by removing the porogens 130 so that the dielectric constant of the dielectric layer 120A can be further reduced.

In this case, the porogens 130 may be formed of at least one selected from the group consisting of branched poly(p-xylene), linear poly(p-phenylene), linear polybutadiene, branched polyethylene, PET, Nylon 6/6, PS-syn, PCL, PPO, polycarbonate, PPS, PAI, PPA (or Amodel), PMS, PEEK, PES, PEK, POM, PBT, PS, poly(norbornene), CTAB, PEO-b-PPO-b-PEO, and CD. The porogens 130 may be formed of pseudo-hydrocarbon expressed by one of the foregoing Formulae 1 through 7, particularly, a carbon-ring-type compound. However, the present inventive concepts are not limited to the above-described materials of the porogens 130.

The substrate 100 may be a rigid substrate or a flexible plastic substrate. The rigid substrate may be a substrate including at least one semiconductor material selected from the group consisting of Si, Ge, SiGe, GaP, GaAs, SiC, SiGeC, InAs, and InP, a SOI substrate, a quartz substrate, or a glass substrate for a display device. The flexible plastic substrate may be formed of polyimide, PET, PEN, PMMA, PC, PES, or polyester.

Meanwhile, forming the dielectric layer 120A on the substrate 100 does not necessarily refer to forming the dielectric layer 120A directly on the substrate 100. For example, a plurality of conductive layers, dielectric layers, or insulating layers may be formed between the substrate 100 and the dielectric layer 120A. In a non-limiting embodiment, the formation of the dielectric layer 120A is illustrated as occurring directly on the substrate 100.

Figure 4B:
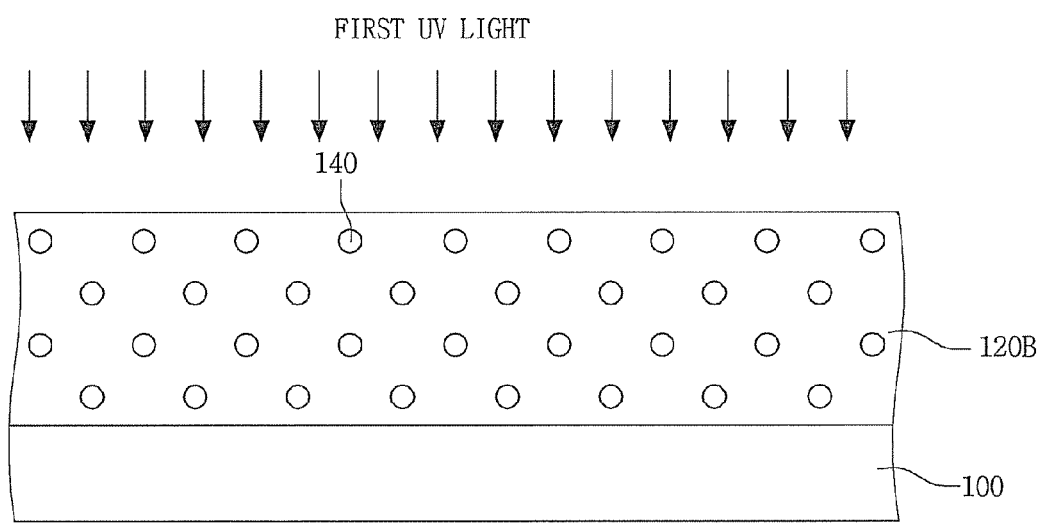

Subsequently, referring to FIGS. 3 and 4B, the porogens 130 may be removed from the dielectric layer 120A using a first UV curing process.

Specifically, all the porogens 130 may be removed using the first UV curing process. By forming pores 140 in places where the porogens 130 existed, the dielectric layer 120A may turn into a porous dielectric layer 120B having a lower dielectric constant than the dielectric layer 120A. The porous dielectric layer 120B having the pores 140 may have a dielectric constant between 1 and 2.5.

In the present non-limiting embodiment of the inventive concepts, the first UV curing process may be performed using a first UV light having broadband wavelengths in which partially summed intensities of each wavelength being equal to or less than 280 nm occupies equal to or less than 15% of total intensity of the first UV light.

The first UV curing process may be performed under process conditions of a temperature between 300 and 500° C. and a pressure between 1 and 100 Torr in an atmosphere of $NH_3$, $H_2$, or an O-containing gas, for example, $N_2O$, $H_2O_2$, $O_2$, or $H_2O$.

In addition, to efficiently remove the porogens 130 and simultaneously, prevent breakage of Si—C and Si—O bonds, the broadband wavelengths may be equal to or more than 260 nm. Since the range of the broadband wavelengths is the same as described above, a detailed description thereof will be omitted.

Figure 4C:
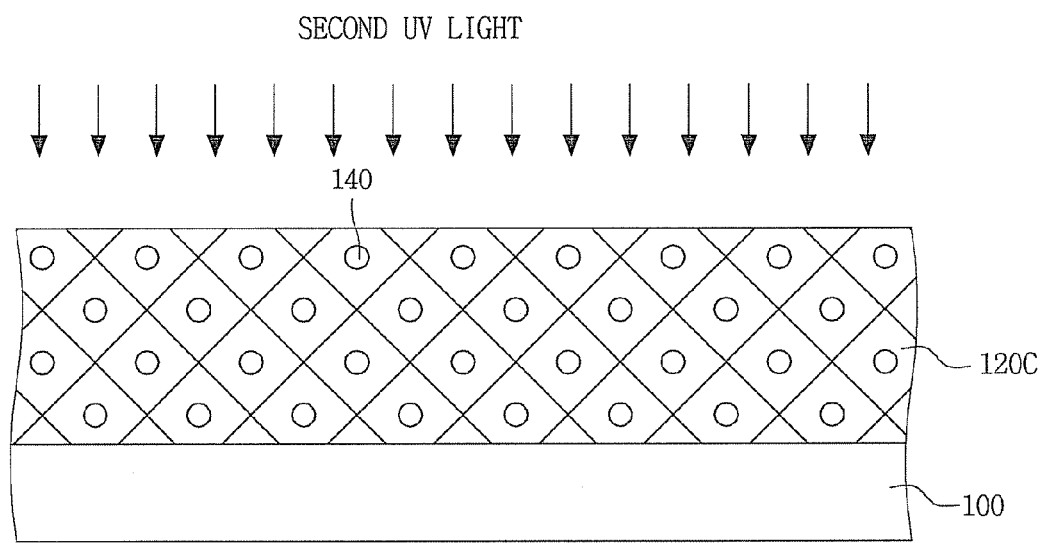

Referring to FIGS. 3 and 4C, a Si—O—Si network may be formed using a second UV curing process.

The porous dielectric layer 120B in which the pores 140 are formed by removing the porogens 130 using the first UV curing process may have a relatively low dielectric constant but lack sufficient hardness.

Accordingly, in the inventive concepts, the porous dielectric layer 120B may undergo the second UV curing process to form a crosslinked porous dielectric layer 120C.

The formation of the crosslinked porous dielectric layer 120C may include forming a Si—O—Si bond to convert a cage-like structure into a network structure, which will be defined as formation of a Si—O—Si network in the present non-limiting embodiment of the inventive concepts.

After the second UV curing process, the hardness of the crosslinked porous dielectric layer 120C may increase because Si—H and Si—OH bonds are bonded to the Si—O—Si bond which is more stable than the Si—H and Si—OH bonds.

According to the inventive concepts, the second UV curing process may be performed using a second UV light having broadband wavelengths in which partially summed intensities of each wavelength being equal to or less than 280 nm occupies equal to or more than 15% of total intensity of the second UV light.

Meanwhile, the second UV curing process may be performed under process conditions of a temperature between 300 and 500° C. and a pressure between 1 and 100 Torr in an atmosphere of an O-containing gas, for example, $N_2O$, $H_2O_2$, $O_2$, or $H_2O$.

In addition, to efficiently form the Si—O—Si network and simultaneously, prevent breakage of the Si—C and Si—O bonds of the crosslinked porous dielectric layer 120C, the broadband wavelengths of the second UV light may be equal to or more than 260 nm. Since the range of the broadband wavelengths of the second UV light are the same as described above, a detailed description thereof will be omitted.

Figure 4D:
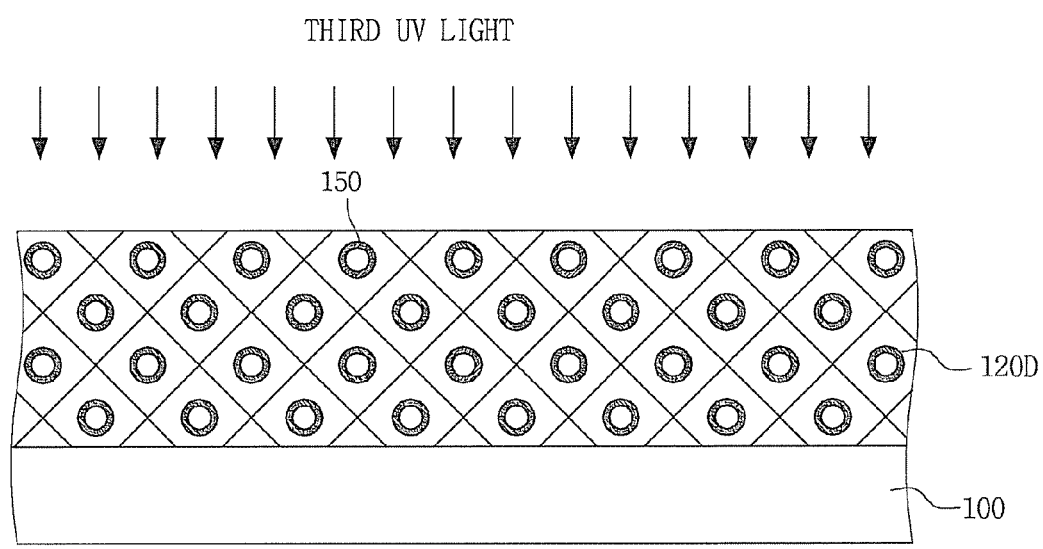

Referring to FIGS. 3 and 4D, pore walls 150 may be passivated using a third UV curing process.

Since the carbon content of the crosslinked porous dielectric layer 120C is reduced through the first and second UV curing processes, the pore walls 150 may be passivated using a third UV curing process to increase the carbon content of the crosslinked porous dielectric layer 120C.

In the present non-limiting embodiment of the inventive concepts, the third UV curing process may be the same as the second UV curing process in those broadband wavelengths in which in intensity of wavelengths equal to or less than 280 nm occupies equal to or more than 15% of total intensity of the third UV light.

However, since the third UV curing process is required to increase the carbon content of the crosslinked porous dielectric layer 120C, the third UV curing process may be performed using a process gas containing carbon atoms corresponding to a general expression: $C_xH_y$. Specifically, the process gas may be $C_2H_2$, $C_2H_4$, or $C_3H_6$.

Meanwhile, the third UV curing process may be performed under process conditions of a temperature between 100 and 450° C. and a pressure between 1 and 100 Torr.

Also, to efficiently increase the carbon content of the crosslinked porous dielectric layer 120C and simultaneously, prevent breakage of the Si—C and Si—O bonds of the crosslinked porous dielectric layer 120C, the broadband wavelengths of the third UV light may include wavelengths being equal to or more than 260 nm, particularly, 280 nm. Since the range of the broadband wavelengths of the third UV light is the same as described above, a detailed description thereof will be omitted.

As a result, a hardened porous dielectric layer 120D may be formed (S20).

Figure 4E:
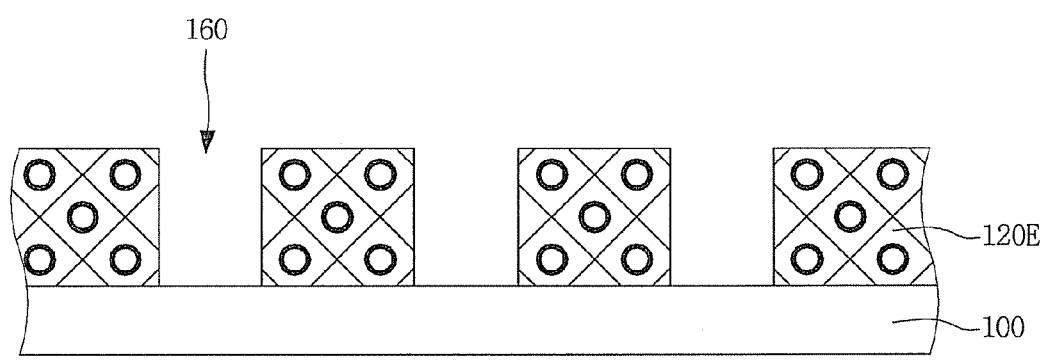

Referring to FIGS. 3 and 4E, a portion of the hardened porous dielectric layer 120D may be etched, thereby faulting a hardened porous dielectric layer pattern 120E having openings 160 (S30). The openings may be understood as trenches or holes.

Figure 4F:
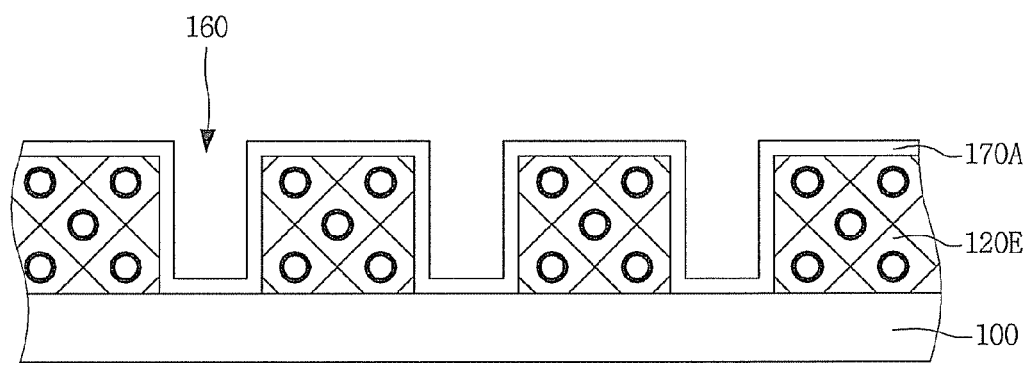

Referring to FIGS. 3 and 4F, a barrier layer 170A may be conformably formed on inner walls of the openings 160 and a top surface of the hardened porous dielectric layer pattern 120E (S40). The barrier layer 170A may prevent atoms of the hardened porous dielectric layer pattern 120E from diffusing away. According to a non-limiting embodiment of the inventive concepts, the barrier layer 170A may include titanium (Ti), tantalum (Ta), tungsten (W), and a nitride thereof. The barrier layer 170A may conformably cover the inner walls and bottom surfaces of the openings 160, and top surfaces of portions where the openings 160 of the hardened porous dielectric layer pattern 120E are not formed.

Meanwhile, the barrier layer 170A may be formed using a CVD process, a physical vapor deposition (PVD) process, or an atomic layer deposition (ALD) process.

Figure 4G:
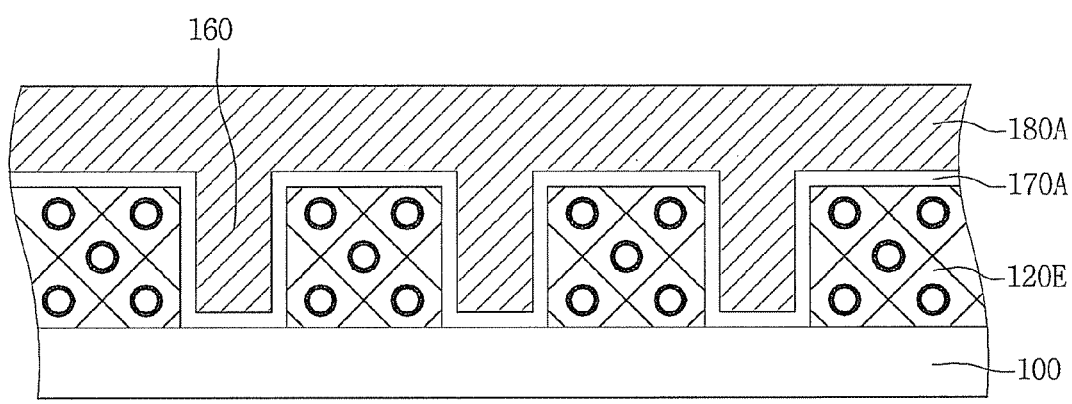

Referring to FIGS. 3 and 4G, a metal layer 180A may be formed on the barrier layer 170A to completely fill the openings 160 (S50). The metal layer 180A may be formed to a sufficient thickness to fill the openings 160 and cover the barrier layer 170A.

According to a non-limiting embodiment of the inventive concepts, the metal layer 180A may include copper, tungsten, cobalt, silver, gold or other metals. For example, after a Cu seed layer (not shown) is formed on the barrier layer 170A, a Cu layer may be formed on the Cu seed layer using a plating process.

According to another non-limiting embodiment, the metal layer 180A may include aluminum (Al), tungsten (W), ruthenium (Ru), Iridium (Ir), rhodium (Rh), osmium (Os), titanium (Ti), tantalum (Ta), palladium (Pd), platinum (Pt), molybdenum (Mo), a metal silicide, and a combination thereof.

Figure 4H:
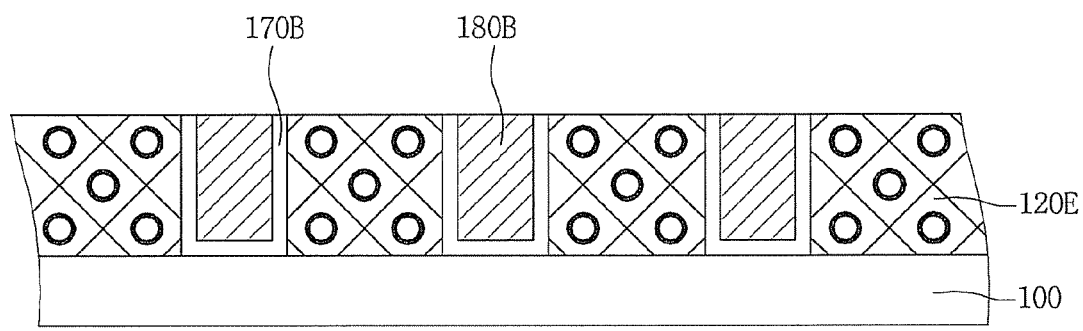

Referring to FIGS. 3 and 4H, the barrier layer 170A formed on a portion of the metal layer 180A and a top surface of the hardened porous dielectric layer pattern 120E may be planarized, thereby forming a metal interconnection 180B (S60). The planarizing of the barrier layer 170A may be performed using the hardened porous dielectric layer pattern 120E as a stopper. Accordingly, the metal layer 180A and the barrier layer 170A may be planarized using the planarizing process to expose the hardened porous dielectric layer pattern 120E. That is, after the planarizing process, the top surface of the hardened porous dielectric layer pattern 120E may be exposed, and a top surface of the metal interconnection 180B may be coplanar with the top surface of the hardened porous dielectric layer pattern 120. The metal interconnection 180B may be electrically insulated from the hardened porous dielectric layer pattern 120E. Simultaneously, the barrier layer 170A may be formed into a barrier layer pattern 170B.

The planarizing process may be performed using a chemical mechanical polishing (CMP) process or an etchback process. For brevity, according to a non-limiting embodiment of the inventive concepts, the formation of a metal interconnection 180B has been described using the CMP process.

Meanwhile, although not shown, after forming the hardened porous dielectric layer pattern 120E, a plasma processing method may be optionally performed (S70).

That is, the plasma processing method may be performed on the surface of the metal interconnection 180B to remove a metal oxide layer that may be formed due to contact of an exposed surface of the metal interconnection 180B with oxygen in the air. Thus, the feasibility of bumps formed on the surface of the metal interconnection 180B may be greatly reduced. The plasma processing method may be performed in an atmosphere of $NH_3$, $H_2$, He, $N_2$, Ar, or a mixture thereof.

Figure 4I:
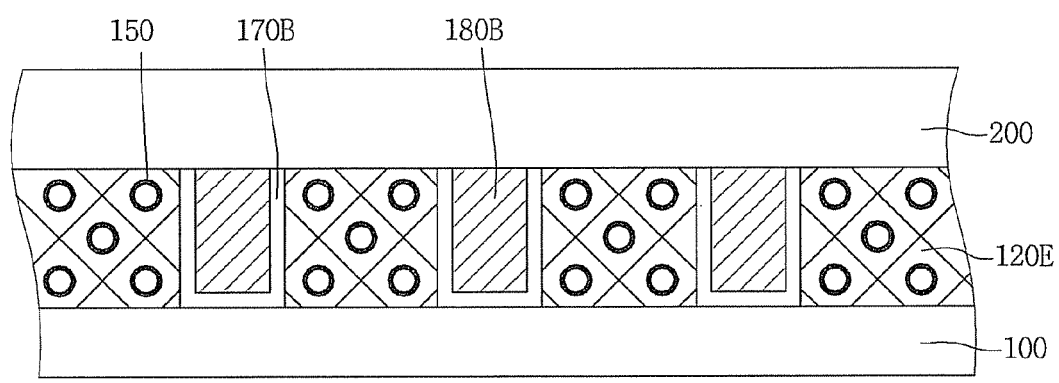

Referring to FIGS. 3 and 4I, after the plasma processing method or after forming the hardened porous dielectric layer pattern 120E when the plasma processing method is omitted, a capping layer 200 may be formed (S80). The capping layer 200 may prevent diffusion of moisture or external ions into the hardened porous dielectric layer pattern 120E and diffusion of metals from the metal interconnection 180B. According to a non-limiting embodiment of the inventive concepts, the capping layer 200 may include a silicon nitride (SiN) layer, a silicon carbon nitride (SiCN) layer, a boron nitride (BN) layer, and a boron carbonitride (BCN) layer. As a result, a semiconductor device according to the inventive concepts may be manufactured. The semiconductor device according to the present inventive concepts is not limited to the above-described embodiments and may be modified into various other types within the scope of the inventive concepts.

According to another non-limiting embodiment of the inventive concepts, a porous dielectric layer may be formed on the substrate. Here, the porous dielectric layer may be a planarization layer without openings. A metal layer may be formed on the porous dielectric layer. Here, a metal interconnection may include Cu or a Cu alloy. The metal layer may be patterned, thereby forming the metal interconnection. Here, to remove moisture absorbed by the porous dielectric layer, UV light having wavelengths between 260 and 450 nm may be irradiated to transform a porous dielectric layer. Subsequently, to prevent further absorption of moisture, a capping layer may be deposited to cover lateral and top surfaces of the metal interconnection and the porous dielectric layer. In this case, the UV curing process and the capping layer deposition process may be performed in-situ without breaking vacuum. Furthermore, before depositing the capping layer, a method of processing the surfaces of the metal interconnection and the porous dielectric layer with plasma may be further performed.

Figure 6:
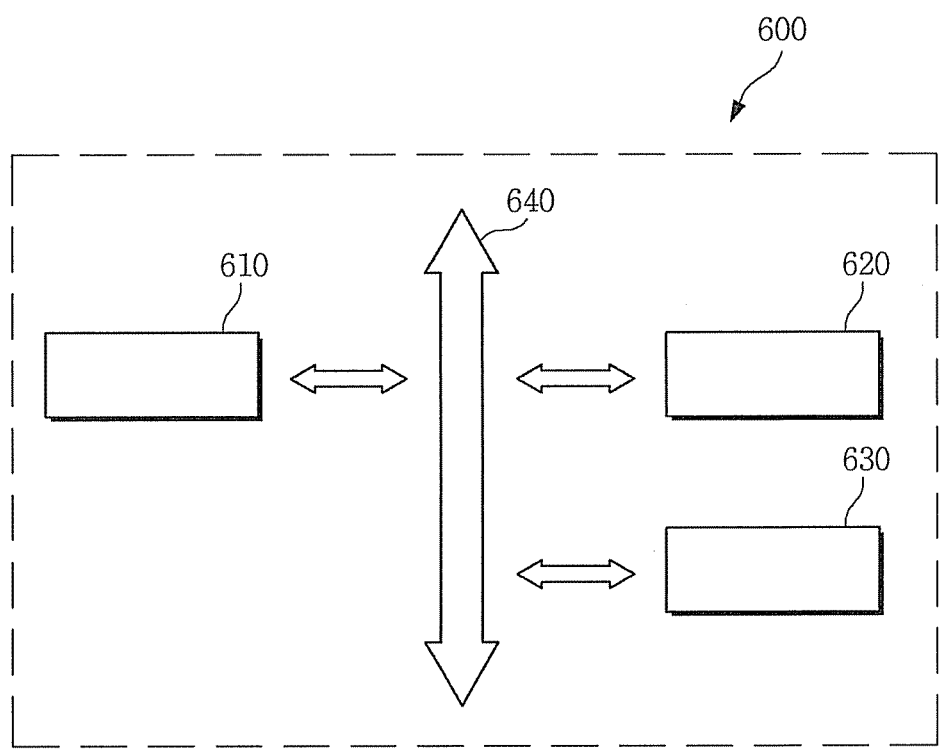
FIG. 6 is a block diagram of an electronic system including a semiconductor device according to example embodiments of the inventive concepts.

FIG. 6 is a schematic block diagram of an electronic system including a semiconductor device including a hardened porous dielectric layer according to example embodiments of the inventive concepts. Referring to FIG. 6, an electronic system 600 may include a controller 610, an input/output (I/O) device 630, a memory device 620, and a bus structure 640. The controller 610 and the memory device 620 may combine into a package-on-package (PoP). The controller 610 and/or the memory device 620 may include a semiconductor device including the hardened porous dielectric layer according to one of the above-described embodiments of the inventive concepts.

The bus structure 640 may provide a path through which data is received or transmitted among the controller 610, the I/O device 630, and the memory device 620.

The controller 610 may include at least one selected from at least one microprocessor (MP), a digital signal processor, a microcontroller, and logic devices capable of similar functions thereto. The I/O device 630 may include at least one selected from a keypad, a keyboard, and a display device. The memory device 620 may store data and/or commands executed by the controller 610.

The memory device 620 may include a volatile memory chip, a non-volatile memory chip, or a combination thereof. The volatile memory chip may be a dynamic random access memory (DRAM) or a static random access memory (SRAM). The non-volatile memory chip may be a flash memory, a phase-change memory, a magnetic random access memory (MRAM), or a resistive random access memory (RRAM).

Furthermore, a wired/wireless interface may be provided to exchange data with a communication network. For example, the interface may include an antenna or a wired/wireless transceiver.

The electronic system 600 may further include an application chipset, a camera image processor (CIS), and an I/O apparatus.

The electronic system 600 may be embodied by a mobile system, a personal computer (PC), an industrial computer, or a logic system capable of various functions. For example, the mobile system may be one selected from the group consisting of a personal digital assistant (PDA), a smart phone, a portable computer, a web tablet, a mobile phone, a wireless phone, a laptop computer, a memory card, a digital music system, and an information transmission/receiving system.

When the electronic system 600 is an apparatus capable of wireless communication, the electronic system 600 may be employed for communication systems, such as a code division multiple access (CDMA) system, a global system for mobile communication (GSM) system, a north American digital cellular (NADC) system, an enhanced-time division multiple access (E-TDMA) system, a wideband code division multiple access (WCDMA) system, or a CDMA2000.

Figure 7:
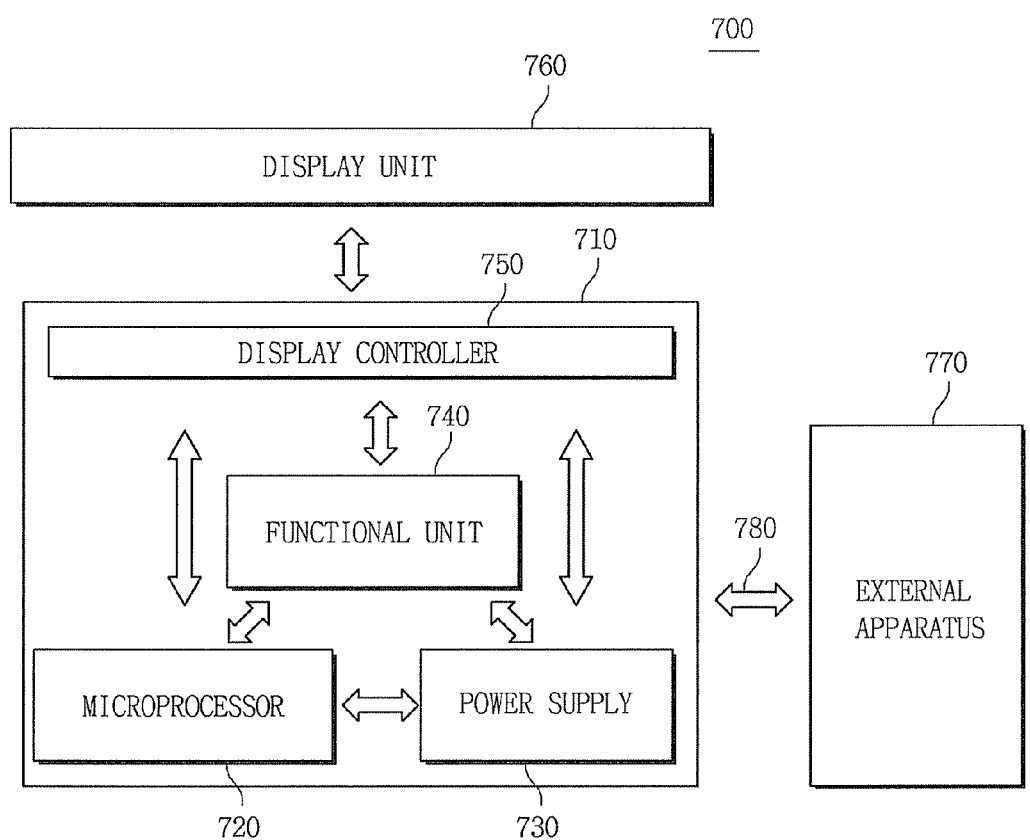
FIG. 7 is a block diagram of a system using a semiconductor device according to example embodiments of the inventive concepts.

FIG. 7 is a block diagram of a system adopting a semiconductor device including a hardened porous dielectric layer according to example embodiments of the inventive concepts. Referring to FIG. 7, an electronic system 700 may include a body 710, a microprocessor 720, a power supply 730, a functional unit 740, and a display controller 750. The microprocessor 720 and/or the functional unit 740 may include a semiconductor device including the hardened porous dielectric layer according to one of the non-limiting embodiments of the inventive concepts.

The body 710 may include a mother board including a printed circuit board (PCB). The microprocessor 720, the power supply 730, the functional unit 740, and the display controller 750 may be mounted on the body 710. The display unit 760 may be disposed inside the body 710 or on the surface of the body 710. For example, the display unit 760 may be disposed on the surface of the body 710 and display an image processed by the display controller 750.

The power supply 730 may function to receive a predetermined voltage from an external battery (not shown), divide the voltage into voltages having required voltage levels, and supply the divided voltages to the Microprocessor 720, the functional unit 740, and the display controller 750.

The microprocessor 720 may receive a voltage from the power supply 730 and control the functional unit 740 and the display unit 760. The functional unit 740 may serve various functions of the electronic system 700. For example, when the electronic system 700 is a portable phone, the functional unit 740 may include several components capable of serving various functions of the portable phone, for example, outputting an image to the display unit 760 or outputting a voice to a speaker, by dialing or communicating with an external apparatus 770. When a camera is also mounted, the functional unit 740 may serve as a camera image processor.

For example, when the electronic system 700 is connected to a memory card for capacity expansion, the functional unit 740 may be a memory card controller. The functional unit 740 may exchange signals with the external apparatus 770 through a wired or wireless communication unit 780. Furthermore, when the electronic system 700 needs a universal serial bus (USB) for functional expansion, the functional unit 740 may serve as an interface controller.

Therefore, the present inventive concepts provide a method of manufacturing a porous dielectric layer having a relatively high hardness and a method of manufacturing a semiconductor device using the same.

The foregoing is merely illustrative of example embodiments and is not to be construed as limiting thereof. Although a few embodiments have been described, those skilled in the art will readily appreciate that many modifications are possible without materially departing from the novel teachings and advantages herein. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a hardened porous dielectric layer, the method comprising:
   forming a dielectric layer containing porogens on a substrate;
   transforming the dielectric layer into a porous dielectric layer using a first UV curing process to remove the porogens from the dielectric layer; and
   transforming the porous dielectric layer into a crosslinked porous dielectric layer using a second UV curing process to generate crosslinks in the porous dielectric layer,
   wherein the first UV curing process includes irradiating a first UV light including broadband wavelengths in which wavelengths being equal to or less than 280 nm are equal to or less than 15% of a first total intensity of the first UV light, and the second UV curing process includes irradiating a second UV light including broadband wavelengths in which wavelengths being equal to or less than 280 nm are equal to or more than 15% of a second total intensity of the second UV light.

2. The method of claim 1, wherein the first UV curing process is performed in an atmosphere of ammonia ($NH_3$), hydrogen ($H_2$), nitrous oxide ($N_2O$), hydrogen peroxide ($H_2O_2$), oxygen ($O_2$), or water ($H_2O$).

3. The method of claim 1, wherein the crosslinked porous dielectric layer has a network structure containing a Si—O—Si bond.

4. The method of claim 1, wherein the second UV curing process is performed in an atmosphere of $N_2O$, $H_2O_2$, $O_2$, or $H_2O$.

5. The method of claim 1, further comprising:
after the second UV curing process, passivating a pore wall with a $C_xH_y$ process gas using a third UV curing process.

6. The method of claim 5, wherein the third UV curing process includes irradiating a third UV light including broadband wavelengths in which wavelengths being equal to or less than 280 nm are equal to or more than 15% a third total intensity of the third UV light.

7. The method of claim 5, wherein the third UV curing process is performed in an atmosphere of gas containing one selected from the group consisting of $C_2H_2$, $C_2H_4$, and $C_3H_6$.

8. The method of claim 5, wherein the third UV curing process is performed at a temperature between 100 and 450° C. under a pressure of about 1 to about 100 Torr.

9. The method of claim 5, wherein the third UV curing process includes irradiating a third UV light including broadband wavelengths in which wavelengths being equal to or less than 260 nm are equal to or more than 15% of third total intensity of the third UV light.

10. The method of claim 1, wherein the dielectric layer includes one selected from the group consisting of a carbon-doped silicon oxide (SiOCH) layer, a silicon oxycarbide (SiOC) layer, and a silicon oxyfluoride (SiOF) layer.

11. The method of claim 1, wherein the porogens include one selected from materials expressed by formulae 1 through 7:

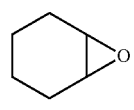

CHO

[Formula 1]

CPO

[Formula 2]

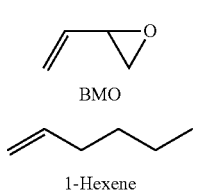

BMO

[Formula 3]

1-Hexene

[Formula 4]

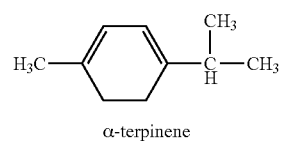

α-terpinene

[Formula 5]

Norbornene

[Formula 6]

Norbornadiene/Bicyclohexadiene (BCHD).

[Formula 7]

12. The method of claim 1, wherein each of the first and second UV curing processes is performed at a temperature between 300 and 500° C. under a pressure of about 1 to about 100 Torr.

13. A method of fabricating a semiconductor device, the method comprising:
forming a crosslinked porous dielectric layer on a substrate with a first UV curing process and a second UV curing process, wherein the first UV curing process includes irradiating a first UV light including broadband wavelengths in which wavelengths being equal to or less than 280 nm are equal to or less than 15% of a first total intensity of the first UV light, and the second UV curing process includes irradiating a second UV light including broadband wavelengths in which wavelengths being equal to or less than 280 nm are equal to or more than 15% of a second total intensity of the second UV light;
forming an opening in the crosslinked porous dielectric layer;
forming a metal interconnection in the opening; and
forming a capping layer on the crosslinked porous dielectric layer and the metal interconnection.

14. The method of claim 13, further comprising:
forming a barrier layer between the crosslinked porous dielectric layer and the metal interconnection.

15. The method of claim 13, wherein forming the crosslinked porous dielectric layer includes:
forming a dielectric layer having porogens;
removing the porogens to form a porous dielectric layer; and
generating crosslinks in the porous dielectric layer.

16. A method of fabricating a hardened porous dielectric layer, the method comprising:
forming a dielectric layer on a substrate, the dielectric layer containing porogens;
removing the porogens from the dielectric layer with a first UV light to transform the dielectric layer into a porous dielectric layer, the first UV light including broadband wavelengths in which wavelengths equal to or less than 280 nm are no more than 15% of a first total intensity of the first UV light; and
generating crosslinks in the porous dielectric layer with a second UV light to transform the porous dielectric layer into a crosslinked porous dielectric layer, the second UV light including broadband wavelengths in which wavelengths equal to or less than 280 nm are at least 15% of a second total intensity of the second UV light.

17. The method of claim 16, wherein the dielectric layer is a carbon-doped silicon oxide (SiOCH) layer, a silicon oxycarbide (SiOC) layer, or a silicon oxyfluoride (SiOF) layer.

18. The method of claim 16, wherein the crosslinked porous dielectric layer has a network structure formed of Si—O—Si bonds.

19. The method of claim 16, further comprising:
passivating pore walls in the crosslinked porous dielectric layer with a third UV light to increase a carbon content of the crosslinked porous dielectric layer.

20. The method of claim 19, wherein the third UV light is irradiated in an atmosphere containing $C_2H_2$, $C_2H_4$, or $C_3H_6$.

* * * * *